US009805938B2

(12) United States Patent
Fujiwara et al.

(10) Patent No.: US 9,805,938 B2
(45) Date of Patent: Oct. 31, 2017

(54) SUBSTRATE PROCESSING APPARATUS AND SUBSTRATE PROCESSING METHOD

(71) Applicant: SCREEN Holdings Co., Ltd., Kyoto (JP)

(72) Inventors: Naozumi Fujiwara, Kyoto (JP); Toru Edo, Kyoto (JP); Yuji Sugahara, Kyoto (JP); Seiji Ano, Kyoto (JP); Jun Sawashima, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/845,554

(22) Filed: Sep. 4, 2015

(65) Prior Publication Data

US 2016/0086810 A1     Mar. 24, 2016

(30) Foreign Application Priority Data

Sep. 18, 2014  (JP) ................................. 2014-190100

(51) Int. Cl.
*H01L 21/306* (2006.01)
*H01L 21/67* (2006.01)
(Continued)

(52) U.S. Cl.
CPC .......... *H01L 21/30604* (2013.01); *B08B 1/04* (2013.01); *B08B 3/02* (2013.01);
(Continued)

(58) Field of Classification Search
None
See application file for complete search history.

(56) References Cited

U.S. PATENT DOCUMENTS

| 7,314,529 B2 | 1/2008 | Nakajima et al. ............... 134/26 |
| 7,422,641 B2 | 9/2008 | Nakajima et al. ............... 134/26 |

(Continued)

FOREIGN PATENT DOCUMENTS

| JP | 2003-209087 | 7/2003 |
| JP | 2005-086181 | 3/2005 |

(Continued)

OTHER PUBLICATIONS

Aug. 22, 2016 Taiwanese Office Action issued for a Taiwanese counterpart of the above-identified application, with English translation of the accompanying Search Report.

*Primary Examiner* — Jiong-Ping Lu
(74) *Attorney, Agent, or Firm* — Ostrolenk Faber LLP

(57) ABSTRACT

A substrate processing apparatus includes a rotating holder for a substrate, a first nozzle used to eject a jet flow, a second nozzle used to discharge a continuous flow, and a nozzle moving unit integrally moving the first and second nozzles. A landing position of the continuous flow is located closer to a rotation center than a landing position of the jet flow is. At least movement paths of the landing positions of the jet flow and the continuous flow or flow directions of the continuous flow and the jet flow are different from each other. The movement paths are made to be different from each other by locating the landing position of the continuous flow downstream of the movement path of the landing position of the jet flow. The flow directions are made to be different from each other by tilting the continuous flow.

4 Claims, 10 Drawing Sheets

(51) Int. Cl.
*H01L 21/02* (2006.01)
*B08B 3/02* (2006.01)
*B08B 3/04* (2006.01)
*B08B 1/04* (2006.01)

(52) U.S. Cl.
CPC ................ *B08B 3/024* (2013.01); *B08B 3/04* (2013.01); *H01L 21/02052* (2013.01); *H01L 21/6704* (2013.01); *H01L 21/6715* (2013.01); *H01L 21/67017* (2013.01); *H01L 21/67023* (2013.01); *H01L 21/67051* (2013.01)

(56) References Cited

U.S. PATENT DOCUMENTS

| | | | |
|---|---|---|---|
| 9,142,399 B2 | 9/2015 | Ishibashi | |
| 9,355,872 B2 | 5/2016 | Tanaka et al. | |
| 2003/0079764 A1* | 5/2003 | Hirose | B08B 3/024 134/95.3 |
| 2005/0115596 A1* | 6/2005 | Nakajima | B01F 3/04007 134/94.1 |
| 2012/0247506 A1 | 10/2012 | Tanaka et al. | |
| 2013/0020284 A1 | 1/2013 | Osada et al. | 216/57 |
| 2013/0220368 A1 | 8/2013 | Ishibashi | |

FOREIGN PATENT DOCUMENTS

| | | |
|---|---|---|
| JP | 2013-251335 | 12/2013 |
| TW | 201303987 A1 | 1/2013 |
| TW | 201335987 A1 | 9/2013 |
| TW | 201414549 A | 4/2014 |

* cited by examiner

F I G. 1 6

|  | X [mm] | | | | |
|---|---|---|---|---|---|
| | | 0 | 5 | 10 | 12.5 | 15 |
| Y [mm] | 0 | > 50 | | 12 | 0/0/0 | 0/0/0 |
| | 12.5 | > 50 | 16 | 0/0/0 | | |
| | 25 | > 50 | | | | |

SUBSTRATE PROCESSING APPARATUS AND SUBSTRATE PROCESSING METHOD

BACKGROUND OF THE INVENTION

Field of the Invention

The present invention relates to substrate processing technology for processing a substrate by supplying a processing solution to the substrate while rotating the substrate. The substrate to be processed includes various substrates such as a semiconductor wafer, a glass substrate for liquid crystal display, a glass substrate for plasma display panel, a substrate for optical disc, a substrate for magnetic disk, a substrate for magneto-optical disk, and a substrate for photomask.

Description of the Background Art

For example, Japanese Patent Application Laid-Open Publication No. 2003-209087 and Japanese Patent Application Laid-Open Publication No. 2005-086181 each disclose, as an apparatus for processing a substrate in the manufacturing process of the substrate, an apparatus including a two-fluid nozzle and a nozzle referred to as a straight nozzle. The two-fluid nozzle is used to mix a processing solution and pressurized gas to generate a jet flow of droplets of the processing solution, and to eject the generated jet flow of droplets onto the substrate. The nozzle referred to as the straight nozzle is used to discharge a continuous flow of the processing solution onto the substrate. These nozzles are integrally scanned with a predetermine distance therebetween along the same path above the substrate to process the substrate.

The substrate processing apparatus disclosed in Japanese Patent Application Laid-Open Publication No. 2003-209087 cleans the substrate by vertically discharging a mist of a relatively large amount of cleaning detergent, such as pure water, from the two-fluid nozzle onto the substrate while vertically discharging a continuous flow of a relatively small amount of cleaning detergent from the straight nozzle onto the substrate to wet the surface of the substrate with the cleaning detergent. This suppresses scattering of the mist on the surface of the substrate compared to a case where the mist of the cleaning detergent is discharged onto a dry substrate, and thereby suppresses watermark-like defects caused by attachment of the scattered mist of the cleaning detergent to the substrate. The apparatus further includes a shield between the two-fluid nozzle and the straight nozzle. This enables the apparatus to suppress scattering of the mist of the cleaning detergent caused by interference of the continuous flow of the cleaning detergent with the mist of the cleaning detergent before they reach the surface of the substrate. The apparatus also suppresses scattering of the cleaning detergent on the surface of the substrate by vertically discharging the continuous flow of the cleaning detergent to wet the surface of the substrate to reduce horizontal kinetic energy of the continuous flow discharged onto the substrate.

Japanese Patent Application Laid-Open Publication No. 2003-209087 discloses, as a modification, a substrate processing apparatus that integrally scans the straight nozzle that vertically discharges the continuous flow of the relatively small amount of cleaning detergent onto the substrate, and a two-fluid nozzle that obliquely discharges the mist of the relatively large amount of cleaning detergent onto the substrate wet by the continuous flow. In the modification, an obliquely-extending shield is provided between the straight nozzle and the two-fluid nozzle, and the two-fluid nozzle is mounted on the shield. This enables the apparatus in the modification to suppress scattering of the mist of the cleaning detergent caused by interference of the continuous flow of the cleaning detergent with the mist of the cleaning detergent before they reach the surface of the substrate.

The substrate processing apparatus disclosed in Japanese Patent Application Laid-Open Publication No. 2005-086181 vertically discharges a continuous flow of an oxidative processing solution, such as ozonated water, from the straight nozzle onto the substrate, and vertically ejects a jet flow of droplets of an etching solution, such as hydrofluoric acid, from the two-fluid nozzle towards the substrate onto an oxide film formed on the substrate to remove foreign matter on the substrate together with the oxide film. The straight nozzle and the two-fluid nozzle are integrally scanned in the apparatus, and thus a processing time of the substrate can be reduced compared to a case where, after the straight nozzle used to discharge the oxidative processing solution is scanned to oxidize the entire upper surface of the substrate, the two-fluid nozzle used to eject the jet flow of droplets of the etching solution is scanned to etch the entire upper surface of the substrate.

In use of the processing solution, such as the etching solution, for processing the film formed on the substrate by chemical reaction, reactivity of the processing solution is usually high when the processing solution is at a high temperature. In etching, the etching rate can be improved by supplying a large amount of etching solution set at a high temperature so as to have high reactivity to the surface of the substrate to be processed. Bubbles may be formed on the surface of the film by chemical reaction between the etching solution and the film. If bubbles are formed, reaction does not proceed in a portion where the bubbles are formed, generating etching residues. When the etching solution supplied to the substrate is at a high temperature, the number of bubbles is large as reactivity of the etching solution is high. In order to effectively suppress generation of etching residues in etching, it is necessary to move the bubbles by stirring a liquid film formed by the etching solution on the substrate while the liquid film is at a high temperature to suppress retention of the bubbles on the surface of the film.

By using an etching technique of, in a short time after the continuous flow of the etching solution set at a predetermined temperature is discharged onto the substrate, ejecting the jet flow of droplets of the etching solution onto the liquid film to stir the liquid film, the etching rate can be improved, and generation of the etching residues can efficiently be suppressed.

The flow rate of the continuous flow discharged from the straight nozzle is easily increased as gas is not mixed, and the speed of the jet flow of droplets ejected from the two-fluid nozzle is easily increased as high-speed pressurized gas and the processing solution are mixed.

As a technique for achieving the above-mentioned etching technique with the apparatus configuration disclosed in Japanese Patent Application Laid-Open Publication No. 2003-209087 and Japanese Patent Application Laid-Open Publication No. 2005-086181 in which the processing solution is vertically discharged from the straight nozzle and the two-fluid nozzle, a technique of discharging a continuous flow of a large amount of etching solution from the straight nozzle onto the substrate, and ejecting, at a high speed, a jet flow of droplets of the etching solution from the two-fluid nozzle onto the liquid film formed by the continuous flow while reducing the distance between the straight nozzle and the two-fluid nozzle is devised.

When the continuous flow of the large amount of etching solution is discharged from the straight nozzle onto the substrate, however, centrifugal force generated by rotation of the substrate, inertial force caused by scanning of the nozzles, movement of the processing solution downstream in the rotation direction of the substrate, spreading of the continuous flow from a landing point that varies depending on the flow rate of the supplied solution, and the like collectively act in the course of spreading of the discharged continuous flow of the etching solution on the substrate. As a result, a raised liquid film that is thicker than a surrounding liquid film is formed on the substrate. The jet flow of droplets ejected from the two-fluid nozzle at a high speed also receives similar force in the course of spreading from the landing position on the substrate, and forms a raised liquid film that is thicker than a surrounding liquid film. In this condition, when the distance between the nozzles is set so that the landing position of the continuous flow of the etching solution and the landing position of the jet flow of droplets of the etching solution become close to each other to efficiently move many bubbles formed on the surface of the film when the etching solution is at a high temperature, a peripheral portion of a raised liquid film 371 formed by a jet flow 361 of droplets may collide with a peripheral portion of a raised liquid film 372 formed by the continuous flow 362 so as to lie on the peripheral portion of the liquid film 372, as illustrated in FIG. 7. In this case, columnar splashes 370 of the solution having a relatively large volume are generated. The splashes 370 are visible droplets having a volume of approximately 0.5 milliliters to several milliliters, for example. The splashes of the etching solution are attached to an inner wall surface of the apparatus and the like, and fall on the substrate W to cause defects on the substrate W. On the other hand, when the landing position of the jet flow 361 of droplets of the etching solution and the landing position of the continuous flow 362 of the etching solution are extremely separated from each other, the splashes 370 are not generated, but the etching solution is not stirred while the etching solution is set at a high temperature so as to have high reactivity, generating many etching residues.

In a case where the above-mentioned etching technique is achieved with the apparatus configuration disclosed in the modification of Japanese Patent Application Laid-Open Publication No. 2003-209087, when a trench (a trench in a pattern formed on the substrate) 11 is vertically formed in the upper surface of the substrate W, and a film U1 formed on the trench T1 is processed, an etching solution 351 near one side wall of the trench T1 formed in the substrate W is not sufficiently stirred as the jet flow 361 of droplets of the etching solution is obliquely ejected as illustrated in FIG. 15. This results in retention of bubbles 99 near one side wall, generating etching residues.

SUMMARY OF THE INVENTION

The present invention is directed to a substrate processing apparatus. A substrate processing apparatus in one aspect of the present invention includes a rotating holder that rotates a substrate while holding the substrate horizontally; a first nozzle that is used to mix a processing solution and pressurized gas to generate a jet flow of droplets of the processing solution, and to eject the jet flow of droplets onto an upper surface of the substrate in an approximately vertical direction; a second nozzle that is used to discharge a continuous flow of the processing solution onto the upper surface of the substrate; and a nozzle moving unit that integrally moves the first nozzle and the second nozzle above the substrate while maintaining a positional relationship between the first nozzle and the second nozzle. The nozzle moving unit moves the first nozzle so that a landing position, on the substrate, of the jet flow of droplets passes through a rotation center of the substrate. In the positional relationship, when the first nozzle is located above a peripheral portion of the substrate, a landing position, on the substrate, of the continuous flow is located closer to the rotation center of the substrate than the landing position of the jet flow of droplets is. At least movement paths of the landing position of the jet flow of droplets and the landing position of the continuous flow on a rotation track of the substrate or flow directions of the continuous flow and the jet flow of droplets are different from each other. The movement paths are made to be different from each other by locating, when the first nozzle is located above the peripheral portion of the substrate, the landing position of the continuous flow downstream of the movement path of the landing position of the jet flow of droplets in a rotation direction of the substrate. The flow directions are made to be different from each other by tilting the direction of the continuous flow with respect to a vertical direction so that a distance between the jet flow of droplets and the continuous flow increases with decreasing distance from the substrate.

A rotational speed vector of the substrate at the landing position of the jet flow of droplets and a rotational speed vector of the substrate at the landing position of the continuous flow are directed away from each other. The flow directions are made to be different from each other by tilting the direction of the continuous flow with respect to the vertical direction so that the distance between the jet flow of droplets and the continuous flow increases with decreasing distance from the substrate. As a result, the distance from the landing position of the continuous flow of the processing solution to a periphery of a raised liquid film formed by the continuous flow closer to the landing position of the jet flow of droplets decreases. When at least the movement paths or the flow directions are different from each other, generation of a collision on the substrate between the liquid film formed by the continuous flow of the processing solution and the liquid film formed by the jet flow of droplets of the processing solution can be suppressed even if the landing position of the jet flow of droplets and the landing position of the continuous flow are brought close to each other to stir the liquid film of the processing solution formed on the substrate while the liquid film is at a high temperature. The jet flow of droplets of the processing solution is vertically ejected, and thus can sufficiently stir the processing solution accumulated in a trench. As a result, when the trench is formed in the surface of the substrate, generation of splashes caused by the collision on the substrate between the continuous flow of the processing solution and the jet flow of droplets of the processing solution supplied to the substrate can be suppressed while generation of processing residues, such as etching residues, is suppressed.

In a substrate processing apparatus in another aspect of the present invention, the movement paths overlap each other, and the flow directions are different from each other.

The landing position of the continuous flow of the processing solution also passes through the rotation center of the substrate, and thus the continuous flow of the processing solution can be supplied to every portion of the substrate including a central region of the substrate. This suppresses variation in temperature on the substrate in its radial direction, and thus suppresses variation in processing rate in every portion of the substrate.

The present invention is also directed to a substrate processing method. A substrate processing method in one aspect of the present invention includes: a first step of rotating a substrate while holding the substrate horizontally; a second step of mixing a processing solution and pressurized gas to generate a jet flow of droplets of the processing solution, and ejecting, in parallel with the first step, the jet flow of droplets onto an upper surface of the substrate in an approximately vertical direction; a third step of discharging, in parallel with the first and second steps, a continuous flow of the processing solution onto the upper surface of the substrate; and a fourth step of integrally moving, in parallel with the first to third steps, the jet flow of droplets and the continuous flow on the substrate while maintaining a positional relationship between the jet flow of droplets and the continuous flow. The fourth step is a step of moving the jet flow of droplets so that a landing position, on the substrate, of the jet flow of droplets passes through a rotation center of the substrate. In the positional relationship, when the landing position of the jet flow of droplets is located in a peripheral portion of the substrate, a landing position, on the substrate, of the continuous flow is located closer to the rotation center of the substrate than the landing position of the jet flow of droplets is. At least movement paths of the landing position of the jet flow of droplets and the landing position of the continuous flow on a rotation track of the substrate or flow directions of the continuous flow and the jet flow of droplets are different from each other. The movement paths are made to be different from each other by locating, when the landing position of the jet flow of droplets is located in the peripheral portion of the substrate, the landing position of the continuous flow downstream of the movement path of the landing position of the jet flow of droplets in a rotation direction of the substrate. The flow directions are made to be different from each other by tilting the direction of the continuous flow with respect to a vertical direction so that a distance between the jet flow of droplets and the continuous flow increases with decreasing distance from the substrate.

In a substrate processing method in another aspect of the present invention, the movement paths overlap each other, and the flow directions are different from each other.

It is an object of the present invention to provide technology, for use in an apparatus for processing a substrate by supplying a processing solution, such as an etching solution, for processing the substrate by chemical reaction from a straight nozzle and a two-fluid nozzle that are integrally scanned, for suppressing generation of splashes caused by a collision on the substrate between a continuous flow of the processing solution and a jet flow of droplets of the processing solution supplied to the substrate while suppressing generation of processing residues, such as etching residues, when a trench is formed in the surface of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 16 shows, in a tabular form, the number of particles attached to the ceiling of a chamber when the substrate is etched by the substrate processing apparatus according to the embodiment.

DESCRIPTION OF THE PREFERRED EMBODIMENTS

Figure 1:
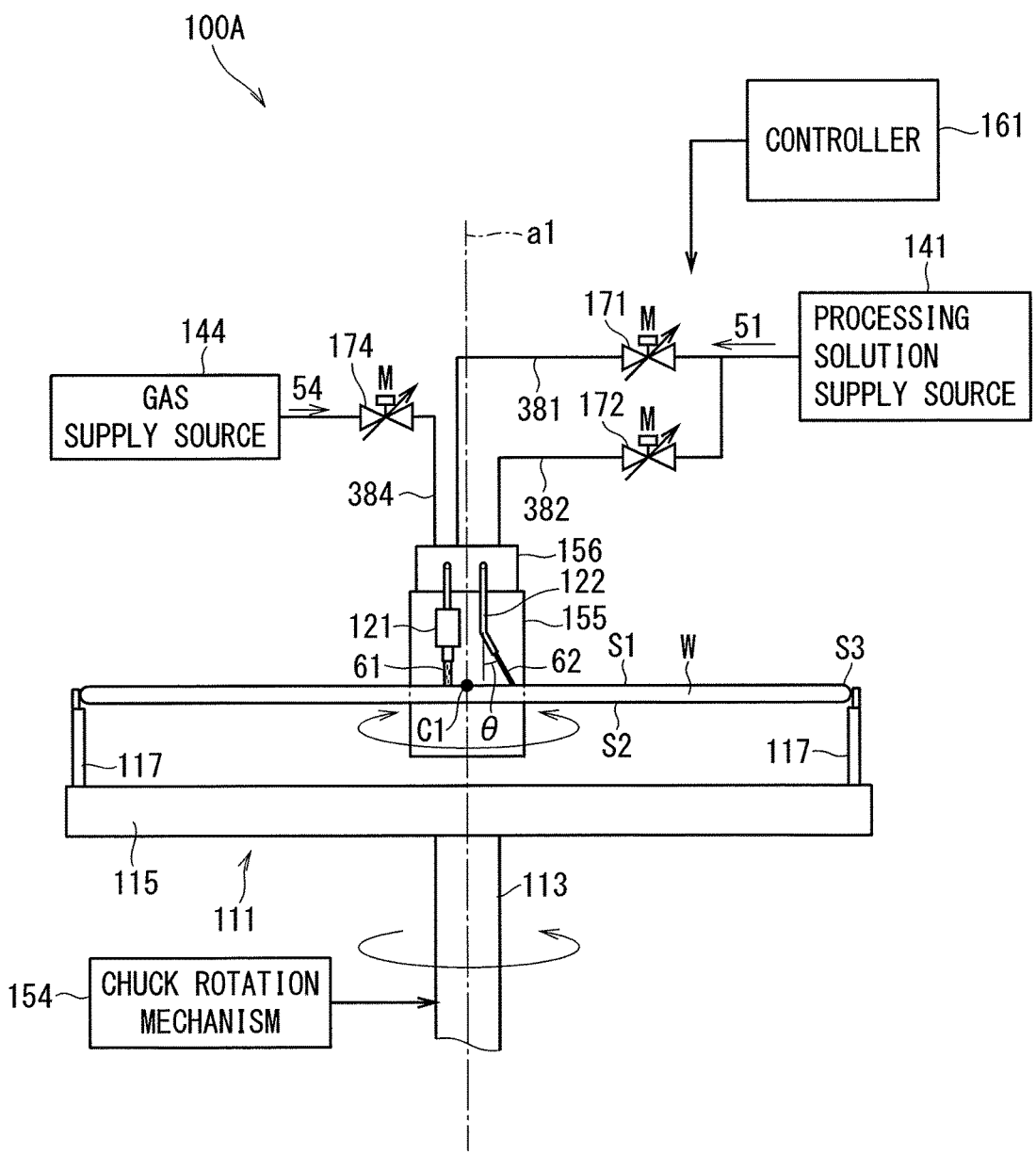
FIG. 1 schematically illustrates an example of configuration of a substrate processing apparatus according to an embodiment.

The following describes embodiments of the present invention based on the drawings. In the drawings, components having similar configuration and functions bear the same reference signs, and description thereof is not repeated below. The drawings are each illustrated schematically. In description of the embodiments, an upward and downward direction is a vertical direction, and a direction towards a substrate W is an upward direction and a direction towards a spin chuck 111 is a downward direction.

EMBODIMENTS

Figure 2:
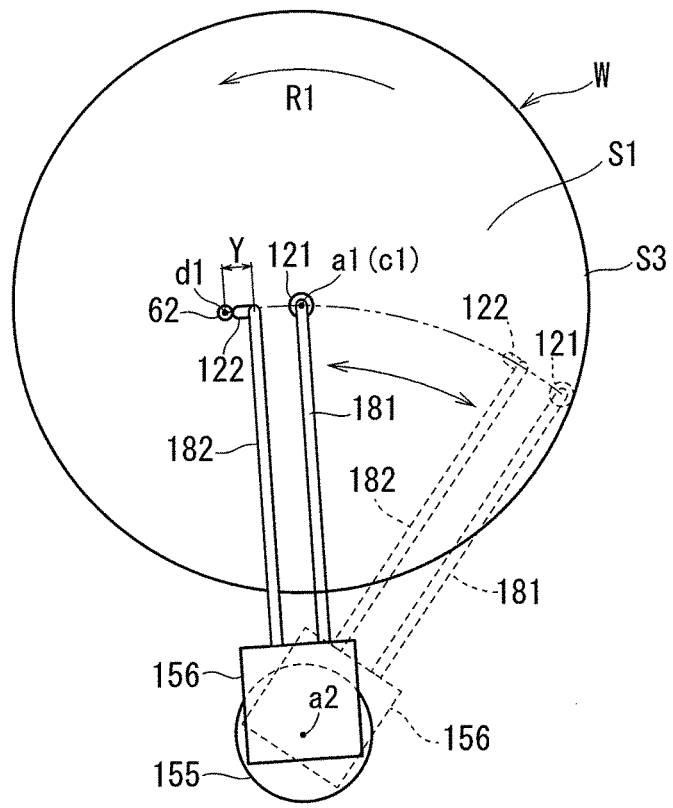
FIG. 2 illustrates two nozzles illustrated in FIG. 1 as viewed from above a substrate.

1. Configuration and Operation of Substrate Processing Apparatus According to Embodiment FIG. 1 schematically illustrates an example of configuration of a substrate processing apparatus 100A according to an embodiment. FIG. 2 illustrates two nozzles 121 and 122 of the substrate processing apparatus 100A as viewed from above the substrate W.

The substrate processing apparatus 100A processes the substrate with use of a processing solution. Specifically, the substrate processing apparatus 100A etches an upper surface (also referred to as a "front surface") S1 of the substrate W, such as a semiconductor wafer, with use of an etching solution, for example, to remove a thin film (waste material)

formed on the upper surface S1. Another example of the processing solution is cleaning detergent, for example. A lower surface S2 opposite the upper surface S1 is also referred to as a "back surface". The surface of the substrate W is approximately circular, and the upper surface S1 of the substrate W refers to a device formation surface on which a device pattern is formed. The substrate W has a radius of 150 mm, for example.

As illustrated in FIG. 1, the substrate processing apparatus 100A includes a spin chuck (a "rotating holder") 111 that rotates the substrate W while holding the substrate W in an approximately horizontal position with its upper surface S1 directed upwards. The spin chuck 111 includes a cylindrical rotation shaft 113 coupled to a rotation axis of a chuck rotation mechanism (a "rotating unit") 154 including a motor, and can be driven by the chuck rotation mechanism 154 to rotate around a rotation axis (vertical axis) a1, i.e., to rotate in an approximately horizontal plane.

A disc-like spin base 115 is integrally coupled to an upper end of the rotation shaft 113 by a fastening part, such as a screw. The rotation shaft 113 and the spin base 115 thus integrally rotate around the rotation axis a1 when the chuck rotation mechanism 154 operates in accordance with an operating command from a controller 161 controlling the apparatus as a whole. The controller 161 controls the chuck rotation mechanism 154 to adjust a rotational speed. The controller 161 is implemented by a CPU executing a program stored in memory, for example.

A plurality of chuck pins 117 are vertically arranged in a peripheral portion of the spin base 115 to grip an annular peripheral portion S3 of the substrate W. The number of chuck pins 117 is three or more to securely hold the substrate W, which is circular. The chuck pins 117 are arranged along the peripheral portion of the spin base 115 at equal angular intervals. Each of the chuck pins 117 includes a substrate supporting part that supports the peripheral portion S3 of the substrate W upwards, and a periphery holding part that laterally presses the peripheral portion S3 supported by the substrate supporting part towards the center of the substrate W to hold the substrate W. Each of the chuck pins 117 can be switched between a pressing state in which the periphery holding part presses the peripheral portion S3 of the substrate W and a releasing state in which the periphery holding part is separated from the peripheral portion S3.

The substrate processing apparatus 100A switches the chuck pins 117 to the releasing state when the substrate W is transferred to and from the spin base 115, and switches the chuck pins 117 to the pressing state when the substrate W is processed with use of the processing solution. By switching the chuck pins 117 to the pressing state, the chuck pins 117 can grip the peripheral portion S3 of the substrate W, and hold the substrate W in the approximately horizontal position with a predetermined distance from the spin base 115. As a result, the substrate W is supported with its front surface (pattern formation surface) S1 directed upwards and with its lower surface S2 directed downwards so that the rotation axis a1 passes through the center of the lower surface S2.

Below the substrate W, a lower nozzle (not illustrated) extending from a central portion to a peripheral portion of the lower surface S2 is provided along the lower surface S2 of the substrate W. An upper surface of the lower nozzle faces the lower surface S2 with a given distance from the lower surface S2. The spin base 115 has, at a central portion thereof, a through hole connected to a through hole of the rotation shaft 113. The lower nozzle is connected to a pure water supply source (not illustrated) external to the apparatus by a pipe (not illustrated) connecting the through hole of the spin base 115 and the through hole of the rotation shaft 113, and receives supply of pure water heated to a predetermined temperature from the pure water supply source. The upper surface of the lower nozzle has a plurality of discharge openings that face and open towards the central portion, the peripheral portion, and other portions of the lower surface S2 of the substrate W. The lower nozzle can discharge the supplied pure water through the discharge openings to the lower surface S2.

The substrate processing apparatus 100A discharges temperature-adjusted pure water from the lower nozzle to the lower surface S2 while rotating the substrate W at a predetermined rotational speed by driving the spin chuck 111 holding the substrate W to rotate with use of the chuck rotation mechanism 154 to adjust the temperature of the substrate W. The substrate processing apparatus 100A ejects a jet flow 61 of droplets of a processing solution 51 from a nozzle ("first nozzle") 121 described later onto the upper surface S1 of the substrate W, and discharges a continuous flow 62 of the processing solution 51 from a nozzle ("second nozzle") 122 described later onto the upper surface S1 to perform predetermined processing (e.g., etching) on the substrate W. Usefulness of the present invention is not impaired in a case where the substrate processing apparatus 100A does not include the lower nozzle, and processes the upper surface S1 with use of the processing solution 51 while adjusting the temperature of the substrate W with use of the processing solution 51 supplied to the upper surface S1.

The substrate processing apparatus 100A further includes a processing solution supply source 141 that supplies the processing solution 51, and a gas supply source 144 that supplies gas 54. The processing solution 51 is a processing solution, such as an etching solution, for processing the substrate by chemical reaction. Ammonia hydrogen peroxide (i.e., a processing solution in which ammonium hydroxide ($NH_4OH$), hydrogen peroxide ($H_2O_2$), and pure water are mixed at a predetermined ratio, hereinafter referred to as "SC-1") is used as the processing solution 51, for example. SC-1 is preferably adjusted to a temperature of 60° C. to 80° C. An aqueous ammonia solution may be used as the processing solution 51, for example. Inert gas, such as nitrogen gas, is used as the gas 54, for example.

The processing solution supply source 141 includes a heater (not illustrated) that can heat the processing solution 51 to be supplied, a temperature sensor (not illustrated) that can detect the temperature of the processing solution 51, and a delivery means (not illustrated), such as a pump, that delivers the processing solution 51.

The gas supply source 144 includes a heater (not illustrated) that can heat the gas 54, a sensor (not illustrated) that can detect the temperature of the gas 54, and a delivery means (not illustrated), such as a pump, that delivers the gas 54.

The controller 161 controls calorific values of the heaters so that the temperature of the processing solution 51 and the temperature of the gas 54 respectively detected by the temperature sensor of the processing solution supply source 141 and the temperature sensor of the gas supply source 144 become the same target temperature to control the temperature of the processing solution 51 and the gas 54. The processing solution supply source 141 and the gas supply source 144 are connected to respective first ends of pipes 381 and 384. The controller 161 operates the pumps of the processing solution supply source 141 and the gas supply source 144, so that the processing solution supply source 141 and the gas supply source 144 deliver a temperature-adjusted processing solution 51 and temperature-adjusted gas 54 to the pipes 381 and 384, respectively. The gas 54 is pressurized to a high pressure to be delivered.

A columnar nozzle rotation mechanism 155 including a motor is provided beside the substrate W held by the spin chuck 111. Operation of the nozzle rotation mechanism 155 is controlled by the controller 161. The nozzle rotation mechanism 155 can rotate in both directions around a rotation axis a2 that passes through the center of an upper surface of the nozzle rotation mechanism 155, and is parallel to the vertical direction. A cuboid base 156 is mounted on the upper surface of the nozzle rotation mechanism 155. Rigid tubular pipe arms 181 and 182 protrude from one side of the base 156. The pipe arms 181 and 182 can pivot around the rotation axis a2 of the nozzle rotation mechanism 155 in an approximately horizontal plane. The pipe arms 181 and 182 extend in parallel to each other in the same horizontal plane. First ends of the pipe arms 181 and 182 penetrate the base 156 from the one side of the base 156 to another side of the base 156. The pipe arms 181 and 182 are thereby held by the base 156. The nozzles 121 and 122 are connected to respective second ends of the pipe arms 181 and 182. The nozzles 121 and 122 are caused to integrally pivot by the nozzle rotation mechanism 155 while maintaining a relative positional relationship.

At the other side of the base 156, the pipes 381 and 384 are inserted into the pipe arm 181 from the first end of the pipe arm 181. Second ends of the pipes 381 and 384 reach the second end of the pipe arm 181, and are connected to the nozzle 121. At the other side of the base 156, a pipe 382 is inserted into the pipe arm 182 from the first end of the pipe arm 182. A second end of the pipe 382 reaches the second end of the pipe arm 182, and is connected to the nozzle 122. The pipe 382 diverges from the pipe 381 at an intermediate point along the pipe 381. The processing solution 51 supplied from the processing solution supply source 141 is distributed to the pipes 381 and 382 at the diverging point. The processing solution 51 and the gas 54 are supplied to the nozzle 121 through the pipes 381 and 384. The processing solution 51 is supplied to the nozzle 122 through the pipe 382.

Valves 171, 172, and 174 are respectively provided along the pipes 381, 382, and 384. The controller 161 controls an opening and closing amount of the valves 171, 172, and 174 through a valve control mechanism, which is not illustrated, so that flow rates of the processing solution 51 and the gas 54 supplied through the pipes 381, 382, and 384 become respective target flow rates.

The nozzle 121 has an ejection opening facing the upper surface S1 of the substrate W. The distance between the discharge opening and the upper surface S1 is set to 6 mm, for example. The nozzle 121 is attached to the pipe arm 181 so that the ejection opening of the nozzle 121 passes above the rotation center c1 of the substrate W when the nozzle 121 is scanned above the substrate W by the nozzle rotation mechanism 155. The nozzle 121 supplies the processing solution 51 to the ejection opening through a flow path communicating with the ejection opening, and supplies, at a high speed, the gas 54 to the ejection opening through another flow path communicating with the ejection opening. The processing solution 51 is supplied at a flow rate of 150 ml/min, for example, and the gas 54 is supplied at a flow rate of 12 L/min, for example. The nozzle 121 is used to mix a high-speed flow of the pressurized gas 54 and the processing solution 51 near the ejection opening to generate the jet flow 61 of droplets of the processing solution 51, and to vertically eject the jet flow 61 from the ejection opening onto the upper surface S1 of the substrate W at a high speed. The jet flow 61 is a fluid in which droplets of the processing solution 51 and the gas 54 are mixed together. Use of such a two-fluid nozzle as the nozzle 121 facilitates control of the flow speed of the jet flow 61. The nozzle rotation mechanism 155 scans the nozzle 121 so that the landing position, on the substrate W, of the jet flow 61 passes through the rotation center c1 of the substrate W.

Each of droplets of the processing solution 51 included in the jet flow 61 has a diameter of approximately 10 urn, for example, and the jet flow 61 contains droplets of the processing solution 51 at a flow rate of 150 ml/min, and is ejected at an ejection speed of 20 m/sec to 50 m/sec, for example. The nozzle 121 may be a nozzle used to discharge, from many fine holes, the processing solution 51 to which a high pressure of 100 MPa to 300 MPa has been applied to generate and discharge the jet flow of droplets of the processing solution, for example.

The nozzle 122 is shaped as if a first end of a first linear cylinder and a second end of a second linear cylinder were connected to each other so that the first and second linear cylinders meet each other obliquely. The nozzle 122 is formed by bending a chemical-resistant resin tube, for example. A first end of the nozzle 122 is connected to the second end of the pipe arm 182. A first-end-side portion of the nozzle 122 vertically extends towards the upper surface S1. A second-end-side portion of the nozzle 122 is connected to the first-end-side portion so as to extend at an angle θ with respect to the extension direction of the first-end-side portion, i.e., the vertical direction, when viewed along the extension direction of the pipe arm 182. As a result, the nozzle 122 is used to discharge a rod-like continuous flow 62 of the processing solution 51 supplied from the processing solution supply source 141 through the pipe arm 182 from the discharge opening at a leading end of the second-end-side portion of the nozzle 122 onto the upper surface S1 of the substrate W in the extension direction of the second-end-side portion. When the ejection opening of the nozzle 121 is located above the rotation center c1 of the substrate W, the landing position, on the upper surface S1, of the continuous flow 62 discharged from the nozzle 122 is a position d1. The position d1 is spaced apart from an intersection of a movement track of the nozzle 122 and the pipe arm 182 by a distance Y set in accordance with the angle θ and the height of the discharge opening of the nozzle 122. The height of the discharge opening, i.e., the distance between the discharge opening and the upper surface S1, is set to 10 mm, for example. The nozzle 122 is attached to the pipe arm 182 so that the continuous flow 62 of the processing solution 51 discharged from the discharge opening of the nozzle 122 passes above the rotation center c1 of the substrate W when the nozzle 122 is scanned above the substrate W by the nozzle rotation mechanism 155.

The continuous flow 62 is discharged from the discharge opening of the nozzle 122 at a flow rate of approximately 1350 ml/min, for example. The nozzle 122 is also referred to as a "straight nozzle". As described above, by supplying a large amount of processing solution 51 from the nozzle 122 to ensure the amount of processing solution 51 required to perform processing, and ejecting, at a high speed, the jet flow 61 of droplets of the processing solution 51 from the nozzle 121 towards the processing solution 51 entering into the pattern to stir the processing solution 51, the film formed on the substrate W can be etched while generation of etching residues is suppressed.

The nozzle rotation mechanism 155 integrally moves the nozzles 121 and 122 above the substrate W while maintaining a positional relationship (the distance and positions) between the nozzles 121 and 122. In this positional relationship, when the nozzle 121 is located above the peripheral portion S3 of the substrate W, the landing position, on the substrate W, of the continuous flow 62 of the processing solution 51 is located closer to the rotation center c1 of the substrate W than the landing position of the jet flow 61 of droplets of the processing solution 51 is. The processing solution 51 discharged from the nozzle 122 onto the upper surface S1 spreads from the landing position on the upper surface S1 to form a liquid film. Centrifugal force generated by rotation of the substrate W acts on the liquid film. When the landing position of the continuous flow 62 is located closer to the rotation center c1 than the landing position of the jet flow 61 is, the liquid film formed by the continuous flow 62 discharged onto the upper surface S1 spreads to a portion below the ejection opening of the nozzle 121 due to centrifugal force generated by rotation of the substrate W. The jet flow 61 is ejected onto the liquid film, and thus can stir the liquid film.

A discharge direction (flow direction) of the continuous flow 62 tilts with respect to an ejection direction of the jet flow 61, i.e., the vertical direction, so that the distance between the jet flow 61 and the continuous flow 62 increases with decreasing distance from the substrate W. This means that the flow directions of the jet flow 61 and the continuous flow 62 are different from each other. The distance between the jet flow 61 and the continuous flow 62 refers to the distance between a central axis of the jet flow 61 and a central axis of the continuous flow 62.

When the substrate W is transferred to and from the spin base 115, the pipe arms 181 and 182 are caused to pivot to withdraw the nozzles 121 and 122 from a transportation path of the substrate W. When the substrate processing apparatus 100A processes the film with use of the processing solution 51, the nozzle rotation mechanism 155 drives the pipe arms 181 and 182 extending from the base 156 to rotate through servo control while the substrate W rotates to scan the nozzles 121 and 122 in both directions relative to a rotation track of the upper surface S1 of the substrate W. As a result, the substrate processing apparatus 100A can process the entire substrate W while ejecting the jet flow 61 from the nozzle 121 onto the liquid film formed on the upper surface S1 by the continuous flow 62. Uniformity of processing is improved by scanning the nozzles 121 and 122 as described above. In this scanning, the nozzle 121 is scanned in both directions between a position above a central region of the upper surface S1 and a position above the peripheral portion S3. Servo control during operation is performed by the controller 161. The positions of the nozzles 121 and 122 can be adjusted with good repeatability and high accuracy by a command from the controller 161.

Figure 3:
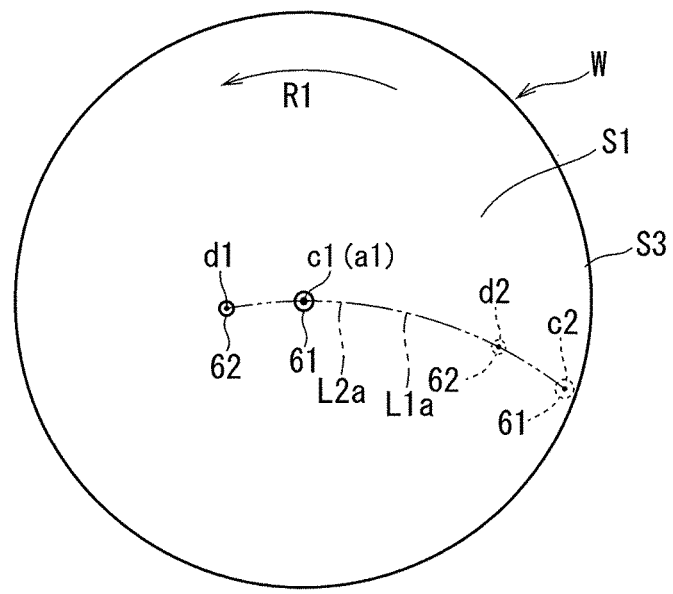
FIG. 3 illustrates movement paths of landing positions of a processing solution supplied from the two nozzles illustrated in FIG. 2.

FIG. 3 illustrates movement paths L1a and L2a of the landing positions of the jet flow 61 of droplets of the processing solution 51 and the continuous flow 62 of the processing solution 51 when the jet flow 61 and the continuous flow 62 are supplied to the upper surface S1 of the substrate W while the nozzles 121 and 122 illustrated in FIG. 2 are scanned by the nozzle rotation mechanism 155. In parallel with scanning of the nozzles 121 and 122, the substrate W rotates while being held by the spin chuck 111.

The movement paths L1a and L2a of the landing positions of the jet flow 61 and the continuous flow 62 on the substrate W overlap each other. The flow directions of the jet flow 61 and the continuous flow 62 are different from each other as a leading-end portion of the nozzle 122 tilts with respect to the vertical direction. The movement paths L1a and L2a are arcs having the rotation axis a2 of the nozzle rotation mechanism 155 as the rotation center, and pass through the rotation center c1 of the substrate W.

When the ejection opening of the nozzle 121 is located above the rotation center c1 of the substrate W so that the landing position of the jet flow 61 is the rotation center c1, the landing position of the continuous flow 62 is the position d1. When the ejection opening of the nozzle 121 is located above the peripheral portion S3 of the substrate W so that the landing position of the jet flow 61 is a position c2 in the peripheral portion S3, the landing position of the continuous flow 62 is a position d2 that is closer to the rotation center c1 than the position c2 is. The positions c2 and d2 are first ends of the movement paths L1a and L2a, and the rotation center c1 and the position d1 are second ends of the movement paths L1a and L2a. The nozzles 121 and 122 are scanned while the positional relationship therebetween is maintained, and thus the distance between the rotation center c1 and the position d1 is equal to the distance between the positions c2 and d2. This distance is set to 50 mm, for example.

Figure 4:
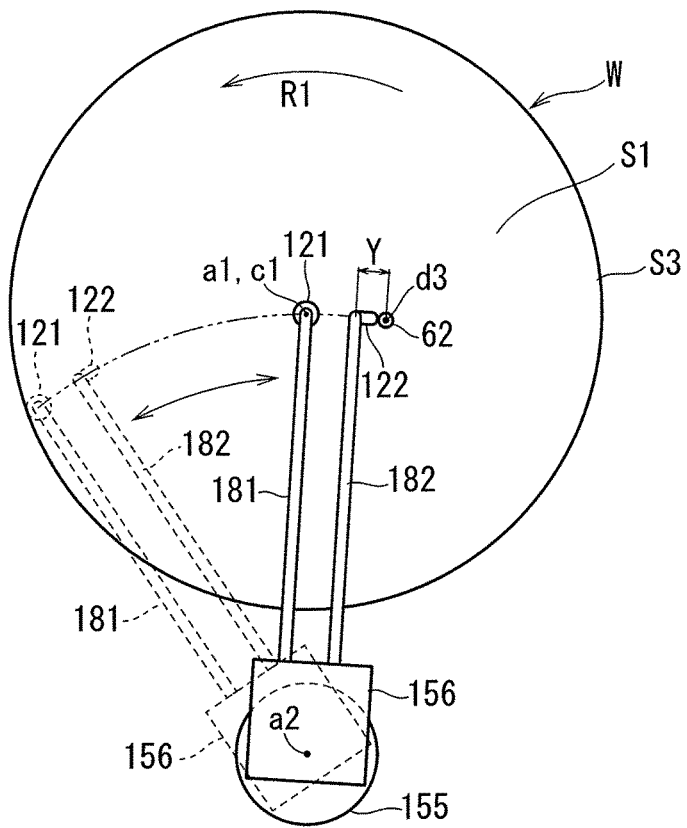
FIG. 4 illustrates another positional relationship between the two nozzles illustrated in FIG. 1.

FIG. 4 illustrates another example of the positional relationship between the nozzles 121 and 122 and the positional relationship between the pipe arms 181 and 182. The pipe arms 181 and 182 extend in parallel to each other in the same horizontal plane. The positions of the pipe arms 181 and 182 and the nozzles 121 and 122 illustrated in FIG. 4 and the positions of the pipe arms 181 and 182 and the nozzles 121 and 122 illustrated in FIG. 2 are reversed (symmetrical) with respect to a vertical plane including the rotation axes a1 and a2.

Figure 5:
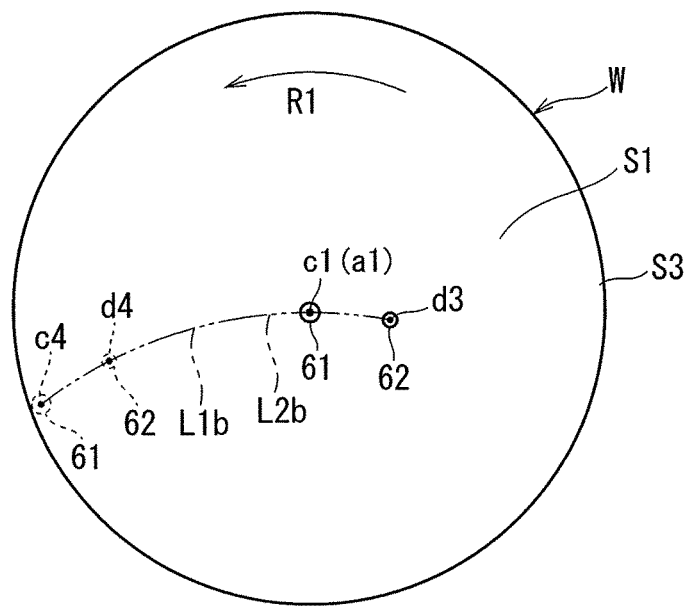
FIG. 5 illustrates movement paths of landing positions of a processing solution supplied from the two nozzles illustrated in FIG. 4.

FIG. 5 illustrates movement paths L1b and L2b of the landing positions of the processing solution 51, i.e., the jet flow 61 and the continuous flow 62, supplied from the two nozzles 121 and 122 illustrated in FIG. 4. When the ejection opening of the nozzle 121 is located above the rotation center c1 of the substrate W so that the landing position of the jet flow 61 is the rotation center c1, the landing position of the continuous flow 62 is a position d3. When the ejection opening of the nozzle 121 is located above the peripheral portion S3 of the substrate W so that the landing position of the jet flow 61 is a position c4 in the peripheral portion S3, the landing position of the continuous flow 62 is a position d4 that is closer to the rotation center c1 than the position c4 is. The rotation center c1 and the position d3 are first ends of the movement paths L1b and L2b, and the positions c4 and d4 are second ends of the movement paths L1b and L2b. The nozzles 121 and 122 are scanned while the positional relationship therebetween is maintained, and thus the distance between the rotation center c1 and the position d3 is equal to the distance between the positions c4 and d4. The movement paths L1b and L2b illustrated in FIG. 5 and the movement paths L1a and L2a illustrated in FIG. 3 are symmetrical with respect to the vertical plane including the rotation axes a1 and a2.

When the nozzles 121 and 122 and the pipe arms 181 and 182 have the positional relationship illustrated in FIG. 4, the nozzle rotation mechanism 155 integrally moves the nozzles 121 and 122 above the substrate W while maintaining the positional relationship between the nozzles 121 and 122. In this integral movement, the landing position, on the substrate W, of the jet flow 61 of droplets ejected from the nozzle 121 passes through the rotation center c1 of the substrate W. When the nozzle 121 is located above the peripheral portion S3 of the substrate W, the landing position, on the substrate W, of the continuous flow 62 is located closer to the rotation center c1 of the substrate W than the landing position of the jet flow 61 of droplets is. The discharge direction of the continuous flow 62 tilts with respect to the ejection direction of the jet flow 61, i.e., the vertical direction, so that the distance between the jet flow 61 and the continuous flow 62 increases with decreasing distance from the substrate W.

Figure 6:
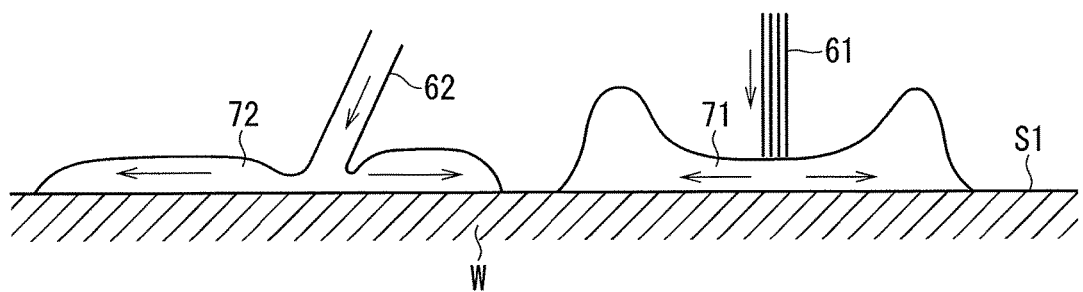
FIG. 6 is a cross section illustrating examples of liquid films formed on the substrate with the two nozzles illustrated in FIG. 1.
Figure 7:
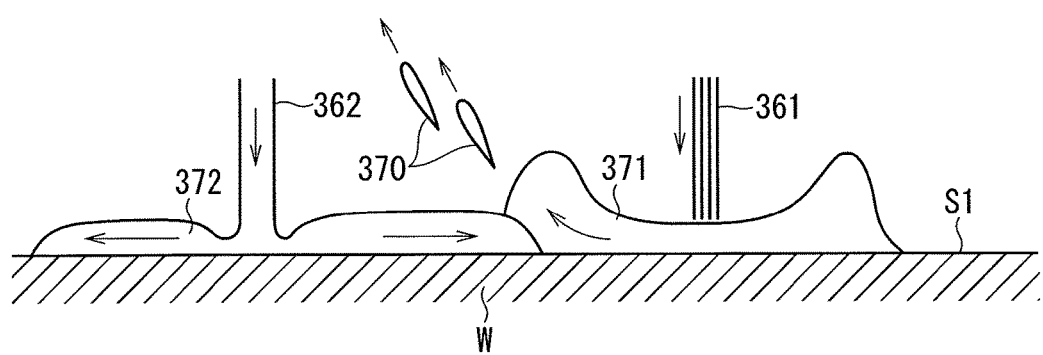
FIG. 7 is a cross section illustrating examples of liquid films formed on the substrate with two nozzles of a substrate processing apparatus according to a comparative art.

FIG. 6 is a cross section illustrating examples of raised liquid films 71 and 72 formed on the upper surface S1 of the substrate W by the jet flow 61 of droplets of the processing solution 51 and the continuous flow 62 of the processing solution 51 supplied from the nozzles 121 and 122 illustrated in FIGS. 2 and 4 to the upper surface S1.

The discharge direction (flow direction) of the continuous flow 62 tilts with respect to the ejection direction of the jet flow 61, i.e., the vertical direction, so that the distance between the jet flow 61 and the continuous flow 62 increases with decreasing distance from the substrate W. The amount of processing solution 51 that spreads from landing position of the continuous flow 62 towards the landing position of the jet flow 61 is small compared to a case where the continuous flow 62 is vertically discharged. The distance of a portion of the liquid film 72 of the processing solution 51 formed on the substrate W by the continuous flow 62 from the landing position of the continuous flow 62 to a periphery of the liquid film 72 closer to the landing position of the jet flow 61 is short compared to the case where the continuous flow 62 is vertically discharged. In order to suppress generation of processing residues, such as etching residues, it is necessary to bring the landing position of the jet flow 61 of droplets and the landing position of the continuous flow 62 close to each other to stir, by the jet flow 61, a liquid film (more specifically, a liquid film of the processing solution 51 that is formed around the raised liquid film 72, and is thinner than the liquid film 72) of the processing solution 51 formed on the substrate W while the liquid film is at a high temperature. When the landing positions of the jet flow 61 and the continuous flow 62 are brought extremely close to each other, however, a raised liquid film 71 formed by the jet flow 61 and the liquid film 72 formed by the continuous flow 62 collide with each other, generating splashes. In the substrate processing apparatus 100A, however, the distance of the portion of the liquid film 72 from the landing position of the continuous flow 62 to the periphery of the liquid film 72 closer to the landing position of the jet flow 61 is short as described above, suppressing a collision on the substrate W between the liquid films 72 and 71. If the liquid films 71 and 72 collide with each other, force generated when the liquid films 71 and 72 collide with each other is weak as the amount of processing solution 51 that spreads from the landing position of the continuous flow 62 towards the landing position of the jet flow 61 is small. As a result, generation of splashes caused by the collision on the substrate W between the jet flow 61 and the continuous flow 62 supplied to the substrate W can be suppressed while generation of processing residues by the processing solution 51 is suppressed.

Figure 14:
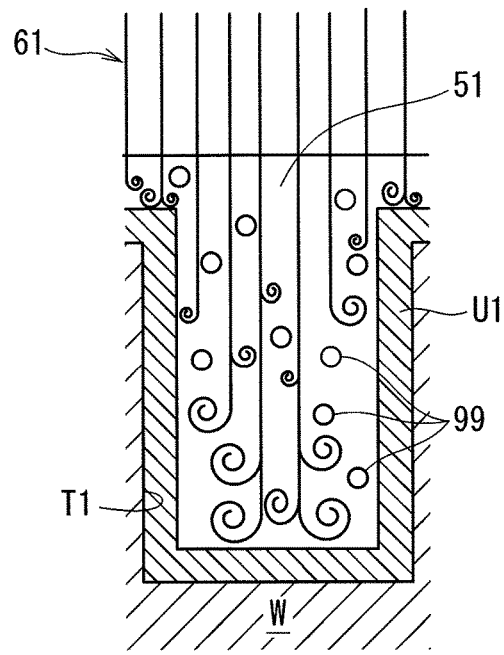
FIG. 14 is a cross section schematically illustrating the state of a jet flow of droplets being ejected from a two-fluid nozzle of the substrate processing apparatus according to the embodiment to a trench.
Figure 15:
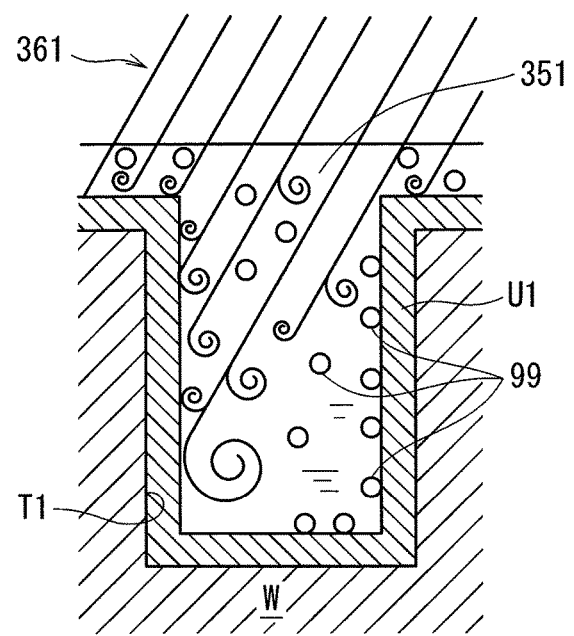
FIG. 15 is a cross section schematically illustrating the state of a jet flow of droplets being ejected from a two-fluid nozzle of the substrate processing apparatus according to the comparative art to the trench.

FIG. 14 is a cross section schematically illustrating the state of the jet flow 61 of droplets of the processing solution 51 being ejected from the nozzle 121 of the substrate processing apparatus 100A to the trench T1. The side wall of the trench T1 is a vertical surface perpendicular to the upper surface S1 of the substrate W, and the jet flow 61 is vertically ejected from the nozzle 121. The jet flow 61 sufficiently stirs the processing solution 51 accumulated in the trench T1 even when bubbles 99 are retained on the film U1 formed on the side wall of the trench T1 by reaction between the film U1 and the processing solution 51. As a result, the bubbles 99 are moved, suppressing retention of the bubbles 99 in the same place on the film U1. Generation of processing residues, such as etching residues, can thus be suppressed when the trench is formed in the upper surface S1 of the substrate W.

In place of the nozzle rotation mechanism 155 and the pipe arms 181 and 182, a scanning mechanism that linearly scans the nozzles 121 and 122 above the upper surface S1 while maintaining the positional relationship between the nozzles 121 and 122 may be used, for example. The nozzles 121 and 122 may be provided at a leading end of an elongated member integrally formed so as to include the pipe arms 181 and 182, and may integrally be scanned. The substrate W that is rotating may be scanned relative to the nozzles 121 and 122 that are held stationary.

As described above, when the substrate processing apparatus 100A processes the substrate W with use of the processing solution 51, rotation of the substrate W caused by the spin chuck 111, ejection of the jet flow 61 of droplets of the processing solution 51 onto the upper surface S1 of the substrate W from the nozzle 121, discharge of the continuous flow 62 of the processing solution 51 onto the upper surface S1 from the nozzle 122, and scanning of the nozzles 121 and 122 performed by the nozzle rotation mechanism 155 are performed in parallel with one another.

Figure 8:
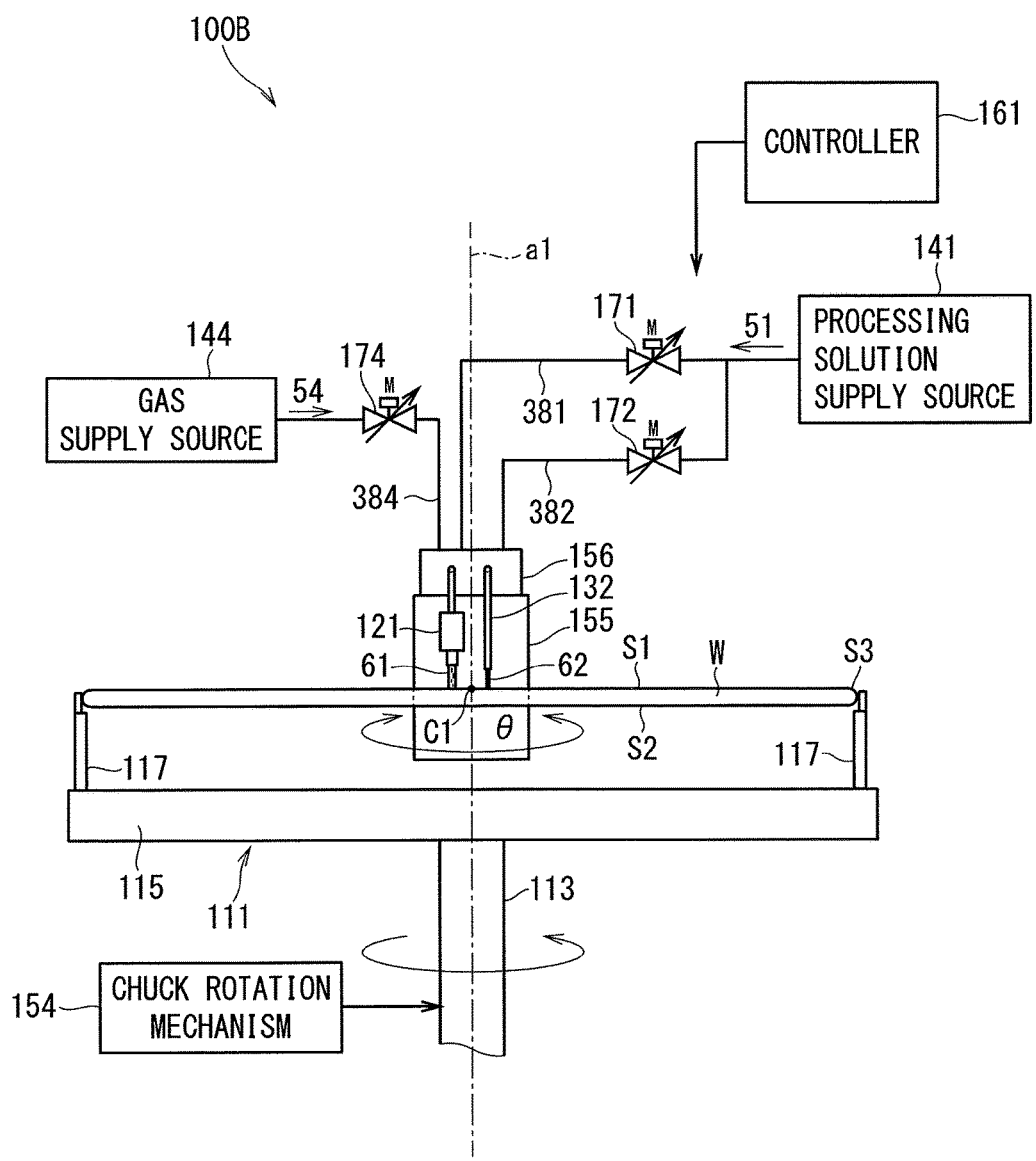
FIG. 8 schematically illustrates an example of configuration of a substrate processing apparatus according to an embodiment.
Figure 9:
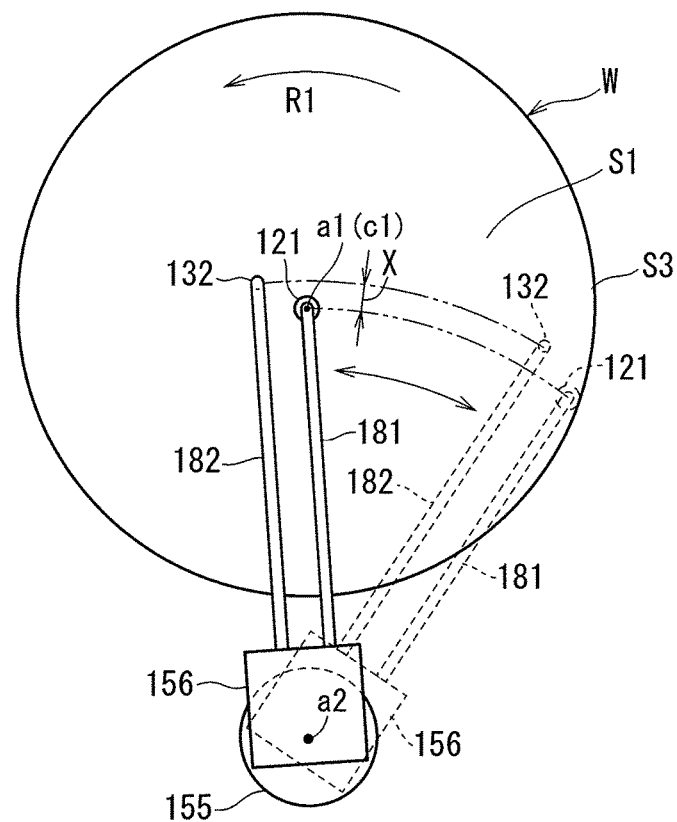
FIG. 9 illustrates two nozzles illustrated in FIG. 8 as viewed from above a substrate.
Figure 10:
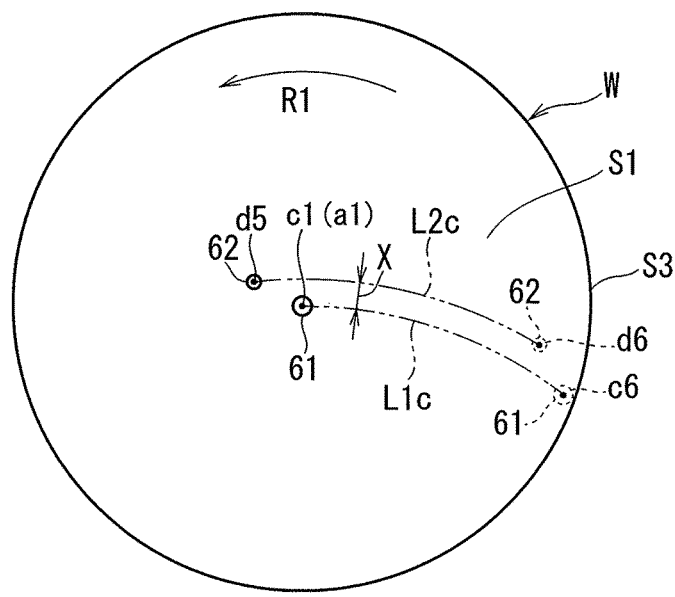
FIG. 10 illustrates movement paths of landing positions of a processing solution supplied from the two nozzles illustrated in FIG. 9.

2. Configuration and Operation of Substrate Processing Apparatus According to Another Embodiment FIG. 8 schematically illustrates an example of configuration of a substrate processing apparatus 100B according to an embodiment. FIG. 9 illustrates two nozzles 121 and 132 illustrated in FIG. 8 as viewed from above the substrate W. FIG. 10 illustrates movement paths L1c and L2c of the landing positions of the processing solution 51 (the jet flow 61 and the continuous flow 62) supplied from the two nozzles 121 and 132 illustrated in FIG. 9.

The substrate processing apparatus 100B has similar configuration and performs similar operation to the substrate processing apparatus 100A except that the substrate processing apparatus 100B includes the nozzle 132 in place of the nozzle 122 of the substrate processing apparatus 100A, and the pipe arm 181 holding the nozzle 121 and the pipe arm 182 holding the nozzle 132 have different lengths from each other. The following describes part of the configuration and operation of the substrate processing apparatus 100B that is different from the configuration and operation of the substrate processing apparatus 100A, and description of similar configuration and operation is omitted except for those relating to the different part.

The pipe arm 181 of the substrate processing apparatus 100B has the same length and the same configuration as the pipe arm 181 of the substrate processing apparatus 100A. The nozzle ("first nozzle") 121 is scanned by the nozzle rotation mechanism 155 along an arcuate path passing above the rotation center c1 of the substrate W in both directions between the position above a central portion and the position above the peripheral portion S3 of the substrate W while being held by the pipe arm 181.

The pipe arm 182 of the substrate processing apparatus 100B is longer than the pipe arm 181. The difference X between the lengths of the pipe arms 182 and 181 is set to 15 mm, for example. The nozzle 132 provided at the leading end (second end) of the pipe arm 182 is thus located farther from the base 156 than the nozzle 121 is by the difference X. The distance between the pipe arms 181 and 182 of the substrate processing apparatus 100B is set to 40 mm, for example.

The nozzle ("second nozzle") 132 of the substrate processing apparatus 100B is used to discharge the rod-like continuous flow 62 of the processing solution 51 supplied from the processing solution supply source 141 onto the upper surface S1 of the substrate W as with the nozzle 122 of the substrate processing apparatus 100A. Although the leading-end-side portion (second-end-side portion) of the nozzle 122 tilts with respect to the vertical direction, the nozzle 132 vertically extends from the leading end of the pipe arm 182 towards the upper surface S1 of the substrate W. A flow path inside the nozzle 132 and a flow path inside the pipe arm 182 communicate with each other. The flow path inside the nozzle 132 is opened at a leading end of the nozzle 132 to form a discharge opening. The discharge opening faces the upper surface S1, and the distance between the upper surface S1 and the discharge opening is set to 10 mm, for example. The continuous flow 62 of the processing solution 51 is vertically discharged from the discharge opening of the nozzle 132.

When the substrate processing apparatus 100B processes the substrate W with use of the processing solution 51, rotation of the substrate W caused by the spin chuck 111, ejection of the jet flow 61 of droplets of the processing solution 51 onto the upper surface S1 of the substrate W from the nozzle 121, discharge of the continuous flow 62 of the processing solution 51 onto the upper surface S1 from the nozzle 132, and scanning of the nozzles 121 and 132 performed by the nozzle rotation mechanism 155 are performed in parallel with one another, as in the substrate processing apparatus 100A.

The nozzle rotation mechanism 155 of the substrate processing apparatus 100B integrally scans the nozzles 121 and 132 above the substrate W while maintaining the positional relationship (the distance and positions) between the nozzles 121 and 132. In this scanning, the nozzle 121 is scanned so as to pass above the rotation center c1 of the substrate W, i.e., so that the landing position, on the substrate W, of the jet flow 61 of droplets of the processing solution 51 passes through the rotation center c1, as with the nozzle 121 of the substrate processing apparatus 100A.

In the positional relationship between the nozzles 121 and 132, when the nozzle 121 is located above the peripheral portion S3 of the substrate W, the landing position, on the substrate W, of the continuous flow 62 discharged from the nozzle 132 is located closer to the rotation center c1 of the substrate W than the landing position of the jet flow 61 of droplets of the processing solution 51 is.

Specifically, as illustrated in FIG. 10, when the nozzle 121 is located above the peripheral portion S3 of the substrate W so that the landing position, on the upper surface S1, of the jet flow 61 ejected from the nozzle 121 is a position c6, the landing position, on the upper surface S1, of the continuous flow 62 discharged from the nozzle 132 is a position d6 that is closer to the rotation center c1 than the position c6 is. When the nozzle 121 is located above the rotation center c1 of the substrate W so that the landing position of the jet flow 61 is the rotation center c1, the position at which the continuous flow 62 is discharged from the nozzle 132 is a position d5.

The movement paths L1c and L2c of the landing position of the jet flow 61 and the landing position of the continuous flow 62 on a rotation track of the substrate W are different from each other. The movement paths L1c and L2c are made to be different from each other by locating, when the nozzle 121 is located above the peripheral portion S3 of the substrate W, the landing position of the continuous flow 62 downstream of the landing position of the jet flow 61 in the rotation direction of the substrate W. The jet flow 61 and the continuous flow 62 are vertically supplied from the nozzles 121 and 132, and thus the difference in position between the movement paths L1c and L2c in a direction of a straight line passing through the rotation axis a2 of the nozzle rotation mechanism 155 is the difference X between the lengths of the pipe arms 181 and 182.

Figure 11:
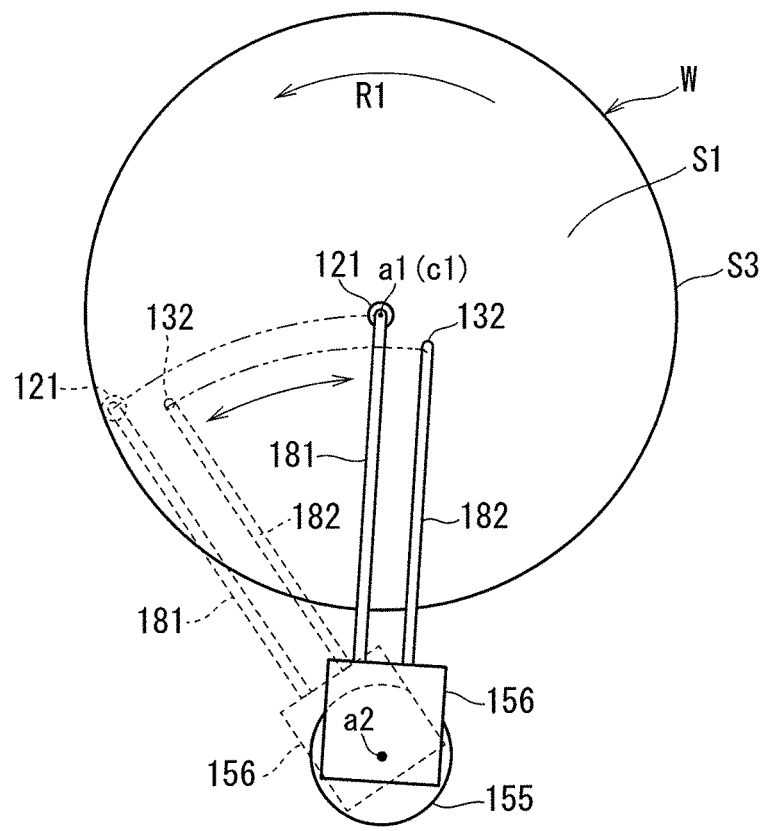
FIG. 11 illustrates another positional relationship between the two nozzles illustrated in FIG. 10.

FIG. 11 illustrates another example of the positional relationship between the nozzles 121 and 132 and the positional relationship between the pipe arms 181 and 182 of the substrate processing apparatus 100B. The pipe arms 181 and 182 illustrated in FIG. 11 extend in parallel to each other in the same horizontal plane. The pipe arm 182 illustrated in FIG. 11 is shorter than the pipe arm 181, in contrast to the pipe arm 182 illustrated in FIG. 9.

Figure 12:
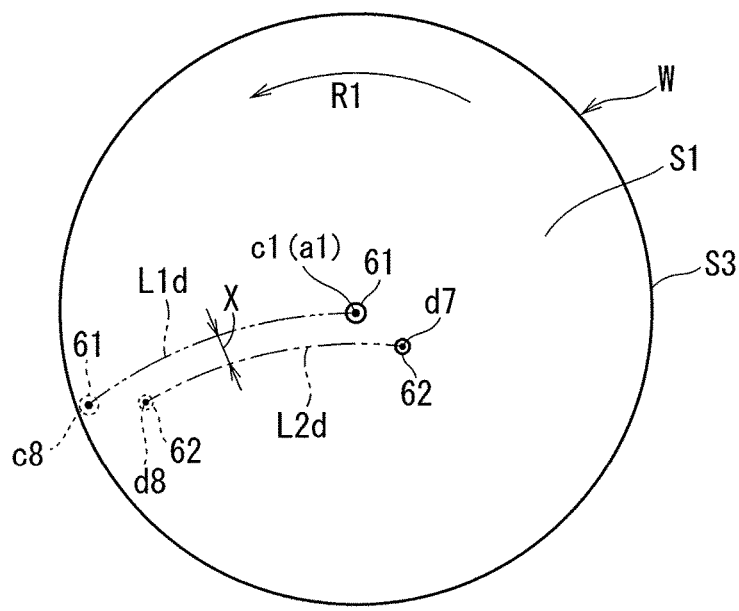
FIG. 12 illustrates movement paths of landing positions of a processing solution supplied from the two nozzles illustrated in FIG. 11.

FIG. 12 illustrates movement paths L1d and L2d of the landing positions of the processing solution 51, i.e., the jet flow 61 and the continuous flow 62, supplied from the two nozzles 121 and 132 illustrated in FIG. 11. When the ejection opening of the nozzle 121 is located above the rotation center c1 of the substrate W so that the landing position of the jet flow 61 is the rotation center c1, the landing position of the continuous flow 62 is a position d7. When the ejection opening of the nozzle 121 is located above the peripheral portion S3 of the substrate W so that the landing position of the jet flow 61 is a position c8 in the peripheral portion S3, the landing position of the continuous flow 62 is a position d8 that is closer to the rotation center c1 than the position c8 is. The rotation center c1 and the position d7 are first ends of the movement paths L1d and L2d, and the positions c8 and d8 are second ends of the movement paths L1d and L2d. The nozzles 121 and 132 are scanned while the positional relationship therebetween is maintained, and thus the distance between the rotation center c1 and the position d7 is equal to the distance between the positions c8 and d8.

The movement path L2c illustrated in FIG. 10 is obtained by sequentially rotating the movement path L1c in accordance with the distance between the pipe arms 181 and 182 illustrated in FIG. 9, and shifting the movement path L1c in accordance with the difference between the lengths of the pipe arms 181 and 182. Similarly, the movement path L2d illustrated in FIG. 12 is obtained by sequentially rotating the movement path L1d in accordance with the distance between the pipe arms 181 and 182 illustrated in FIG. 11, and shifting the movement path L1d in accordance with the difference between the lengths of the pipe arms 181 and 182.

When the nozzles 121 and 132 and the pipe arms 181 and 182 have the positional relationship illustrated in FIG. 11, the nozzle rotation mechanism 155 integrally moves the nozzles 121 and 132 above the substrate W while maintaining the positional relationship between the nozzles 121 and 132. In this integral movement, the landing position, on the substrate W, of the jet flow 61 of droplets ejected from the nozzle 121 passes through the rotation center c1 of the substrate W. When the nozzle 121 is located above the peripheral portion S3 of the substrate W, the landing position, on the substrate W, of the continuous flow 62 is located closer to the rotation center c1 of the substrate W than the landing position of the jet flow 61 of droplets is. Furthermore, when the nozzle 121 is located above the peripheral portion S3 of the substrate W, the landing position of the continuous flow 62 is located downstream of the landing position of the jet flow 61 in the rotation direction of the substrate W.

Figure 13:
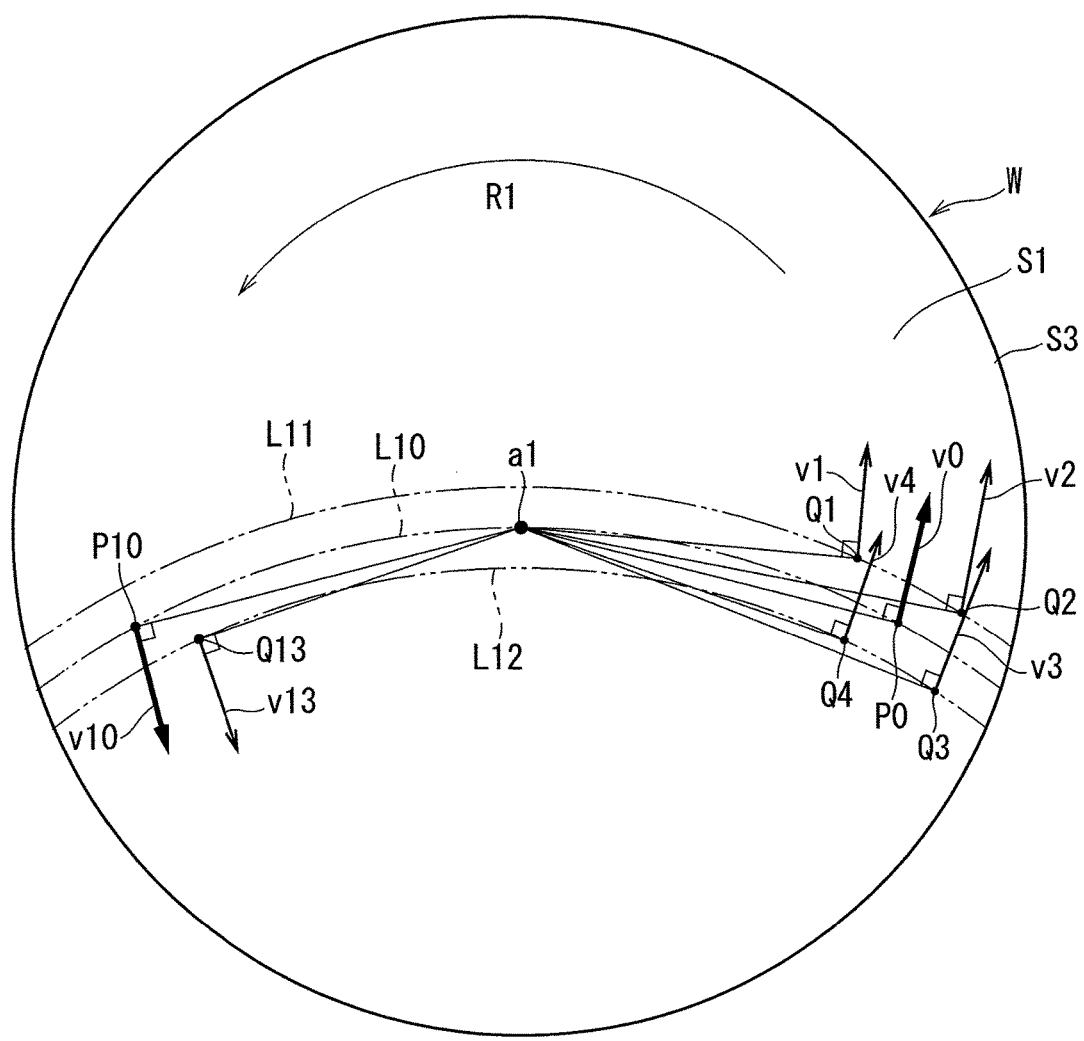
FIG. 13 illustrates landing positions of the processing solution, and rotational speed vectors of the substrate at the landing positions.

FIG. 13 illustrates landing positions P0 and P10 of the jet flow 61 on the upper surface S1 of the substrate W, rotational speed vectors v0 and v10 of the substrate W at the landing positions P0 and P10, landing positions Q1 to Q4 and Q13 of the continuous flow 62, and rotational speed vectors v1 to v4 and v13 of the substrate W at the landing positions Q1 to Q4 and Q13. The landing positions P0 and P10 are located on a movement path L10 passing through the rotation center of the substrate W. The landing positions Q1 and Q2 are located on a movement path L11, and the landing positions Q3, Q4, and Q13 are located on a movement path L12.

When the landing position of the jet flow 61 is the position P0, the positions Q1 and Q4 are located closer to the rotation center c1 of the substrate W than the position P0 is, and the positions Q2 and Q3 are located closer to the peripheral portion S3 of the substrate W than the position P0 is.

The positions Q1 and Q2 are located downstream of the position P0 (movement path L10) in the rotation direction of the substrate W. The positions Q3 and Q4 are located upstream of the position P0 (movement path L10) in the rotation direction of the substrate W. In this case, the distance between positions of two imaginary points moving from the positions P0 and Q1 along the rotational speed vectors v0 and v1 increases as time passes. The distance between positions of two imaginary points moving from the positions P0 and Q3 along the rotational speed vectors v0 and v3 also increases as time passes. On the other hand, the distance between positions of two imaginary points moving from the positions P0 and Q2 along the rotational speed vectors v0 and v2 decreases as time passes. The distance between positions of two imaginary points moving from the positions P0 and Q4 along the rotational speed vectors v0 and v4 also decreases as time passes.

That is to say, the jet flow 61 and the continuous flow 62 supplied at the positions P0 and Q1 are dragged in the rotation direction of the upper surface S1 due to viscosity, and thus receive force to move them away from each other. The jet flow 61 and the continuous flow 62 supplied at the positions P0 and Q3 also receive force to move them away from each other. On the other hand, the jet flow 61 and the continuous flow 62 supplied at the positions P0 and Q2 receive force to move them towards each other. The jet flow 61 and the continuous flow 62 supplied at the positions P0 and Q4 also receive force to move them towards each other.

In terms of suppressing a collision between liquid films formed on the upper surface S1 by the jet flow 61 and the continuous flow 62, it is preferable to discharge the continuous flow 62 at the positions Q1 and Q3 from among the positions Q1 to Q4 when the jet flow 61 is ejected at the position P0.

On the other hand, the processing solution 51 supplied to the upper surface S1 is moved towards the periphery of the substrate W by centrifugal force generated by rotation of the substrate W. As described above, in order to perform processing, such as etching, on the film formed on the upper surface S1 of the substrate W while suppressing processing residues, it is necessary to eject the jet flow 61 from the nozzle 121 towards the liquid film formed by the continuous flow 62 while the liquid film is located below the nozzle 121 to stir the liquid film. In terms of delivering the liquid film formed by the continuous flow 62 to the position below the nozzle 121 by centrifugal force, it is preferable to discharge the continuous flow 62 at the positions Q1 and Q4 from among the positions Q1 to Q4 when the jet flow 61 is ejected at the position P0.

In order to suppress generation of processing residues while suppressing a collision on the substrate W between the liquid films formed by the jet flow 61 and the continuous flow 62, it is desirable that the liquid films of the jet flow 61 and the continuous flow 62 supplied to the upper surface S1 be dragged in the rotation direction of the substrate W due to viscosity, and receive force to move them away from each other, and the liquid film of the continuous flow 62 be moved to the position below the nozzle 121 by centrifugal force generated by rotation of the substrate W, and receive ejection of the jet flow 61.

When the jet flow 61 is ejected at the position P0, and the continuous flow 62 is discharged at the position Q1 from among the positions Q1 to Q4, this condition is satisfied. Similarly, when the jet flow 61 is ejected at the position P10, and the continuous flow 62 is discharged at the position Q13, this condition is satisfied.

The nozzles 121 and 132 are scanned while the positional relationship therebetween is maintained. In a case where the jet flow 61 is ejected at the position P0 (P10), and the continuous flow 62 is discharged at the position Q1 (Q13), when the nozzle 121 is located above the peripheral portion S3 of the substrate W, the landing position of the continuous flow 62 is located closer to the rotation center c1 of the substrate W than the landing position of the jet flow 61 is, and is located downstream of the landing position of the jet flow 61 in the rotation direction of the substrate W.

When the nozzles 121 and 132 of the substrate processing apparatus 100B are integrally moved while the positional relationship between the nozzles 121 and 132 is maintained, generation of processing residues can be suppressed while generation of splashes caused by the collision between the liquid films formed by the jet flow 61 and the continuous flow 62 is suppressed.

In the substrate processing apparatus 100B, the jet flow 61 of droplets of the processing solution 51 is vertically ejected onto the substrate W that rotates in an approximately horizontal plane, and thus generation of etching residues can be suppressed when a trench is formed in the upper surface S1 of the substrate W.

In the above-mentioned substrate processing apparatus 100A, when the nozzle 121 is located above the peripheral portion S3 of the substrate W, the landing position of the continuous flow 62 discharged from the nozzle 122 is located downstream of the landing position of the jet flow 61 in the rotation direction of the substrate W, as in the substrate processing apparatus 100B.

The positional relationship between the nozzles 121 and 122 of the substrate processing apparatus 100A may further include the positional relationship similar to that between the nozzles 121 and 132 of the substrate processing apparatus 100B, and the positional relationship between the nozzles 121 and 132 of the substrate processing apparatus 100B may further include the positional relationship similar to that between the nozzles 121 and 122 of the substrate processing apparatus 100A.

That is to say, the substrate processing apparatus according to the embodiment includes: a spin chuck 111 that rotates the substrate W while holding the substrate W horizontally; a first nozzle (the nozzle 121) that is used to mix the processing solution 51 and pressurized gas 54 to generate the jet flow 61 of droplets of the processing solution 51, and to eject the jet flow 61 onto the upper surface S1 of the substrate W in an approximately vertical direction; and a second nozzle (the nozzles 122 and 132) that is used to discharge the continuous flow 62 of the processing solution 51 onto the upper surface S1 of the substrate W. The substrate processing apparatus further includes the nozzle rotation mechanism 155 that integrally moves the first nozzle and the second nozzle above the substrate W while maintaining the positional relationship between the first nozzle and the second nozzle. The nozzle rotation mechanism 155 moves the first nozzle so that the landing position, on the substrate W, of the jet flow 61 passes through the rotation center c1 of the substrate W. In the above-mentioned positional relationship, when the first nozzle is located above the peripheral portion S3 of the substrate W, the landing position, on the substrate W, of the continuous flow 62 is located closer to the rotation center c1 than the landing position of the jet flow 61 is. At least the movement paths of the landing position of the jet flow 61 and the landing position of the continuous flow 62 on the rotation track of the substrate W or the flow directions of the jet flow 61 and the continuous flow 62 are different from each other. The movement paths are made to be different from each other by locating, when the first nozzle is located above the peripheral portion S3 of the substrate W, the landing position of the continuous flow 62 downstream of the landing position of the jet flow 61 in the rotation direction of the substrate W. The flow directions are made to be different from each other by tilting the direction of the continuous flow 62 with respect to the vertical direction so that the distance between the jet flow 61 and the continuous flow 62 increases with decreasing distance from the substrate W.

FIG. 16 shows, in a tabular form, the number of particles attached to the ceiling of a chamber for storing the substrate processing apparatus when the substrate W is etched by the substrate processing apparatus according to the embodiment.

The distance X shown in FIG. 16 represents the difference between the lengths of the pipe arms 181 and 182 as illustrated in FIGS. 9 and 10. The distance X is set to five values, namely, 0 mm, 5 mm, 10 mm, 12.5 mm, and 15 mm. The distance Y represents the distance between the landing position d1, on the upper surface S1, of the continuous flow 62 discharged from the second nozzle and the intersection of the movement track of the second nozzle (nozzle 122) and the pipe arm 182 as illustrated in FIG. 2. The distance Y is produced because the leading-end-side portion of the second nozzle tilts with respect to the vertical direction. The distance Y is set to three values, namely, 0 mm, 12.5 mm, and 25 mm. Revolution per minute of the substrate W is 600 rpm, and the flow rate of the continuous flow 62 is 1500 ml/min, and the flow rate of the gas 54 (nitrogen gas) is 35 L/min. A nozzle scanning speed is set such that the nozzles are scanned in 1.5 seconds both in scanning from the center to the peripheral portion of the substrate and in scanning from the peripheral portion to the center of the substrate.

FIG. 16 shows the number of particles measured when the substrate W is processed in positional relationships between the first nozzle and the second nozzle determined by the distances X and Y. In measurement shown by dots, processing is performed three times, and the number of particles is measured each time.

As shown in FIG. 16, when the distance X is 0 mm, the number of particles exceeds 50 regardless of the value of the distance Y. When the distance X is 12.5 mm or 15 mm, the number of particles is 0 in measurement performed three times even if the distance Y is 0 mm. When the distance X is 10 mm and the distance Y is 0 mm, 12 particles are measured. When the distance Y is changed to 12.5 mm, however, the number of particles is 0 in measurement performed three times. The measurement results suggest that it is preferable to set the distance X to 15 mm.

According to the substrate processing apparatus in the embodiment having the above-mentioned configuration, when the nozzle 121 (first nozzle) is located above the peripheral portion S3 of the substrate W, the landing position of the continuous flow 62 of the processing solution 51 is located closer to the rotation center c1 of the substrate W than the landing position of the jet flow 61 of droplets of the processing solution 51 is, and at least the movement paths of the landing position of the jet flow 61 and the landing position of the continuous flow 62 on the rotation track of the substrate W or the flow directions of the jet flow 61 and the continuous flow 62 are different from each other. The movement paths are made to be different from each other by locating, when the nozzle 121 is located above the peripheral portion S3 of the substrate W, the landing position of the continuous flow 62 downstream of the landing position of the jet flow 61 in the rotation direction of the substrate W. As a result, the rotational speed vector of the substrate W at the landing position of the jet flow 61 and the rotational speed vector of the substrate W at the landing position of the continuous flow 62 are directed away from each other. The flow directions are made to be different from each other by tilting the direction of the continuous flow 62 with respect to the vertical direction so that the distance between the jet flow 61 and the continuous flow 62 increases with decreasing distance from the substrate W. As a result, the distance from the landing position of the continuous flow 62 to a periphery of the raised liquid film formed by the continuous flow 62 closer to the landing position of the jet flow 61 decreases. When at least the movement paths or the flow directions are different from each other, generation of a collision on the substrate W between the liquid films formed by the jet flow 61 and the continuous flow 62 can be suppressed even if the landing position of the jet flow 61 and the landing position of the continuous flow 62 are brought close to each other to stir the liquid film of the processing solution 51 formed on the substrate W while the liquid film is at a high temperature. The jet flow 61 is vertically ejected, and thus can sufficiently stir the processing solution 51 accumulated in the trench. As a result, when the trench is formed in the surface of the substrate W, generation of splashes caused by the collision on the substrate W between the continuous flow 62 and the jet flow 61 supplied to the substrate W can be suppressed while generation of processing residues, such as etching residues, is suppressed.

According to the substrate processing apparatus in the embodiment having the above-mentioned configuration, the movement paths of the landing position of the continuous flow 62 of the processing solution 51 and the landing position of the jet flow 61 of droplets of the processing solution 51 overlap each other, and the nozzle 121 is moved so as to pass through the rotation center c1 of the substrate W. The landing position of the continuous flow 62 also passes through the rotation center c1 of the substrate W, and thus the continuous flow 62 can be supplied to every portion of the substrate W including the central region of the substrate W. This suppresses variation in temperature on the substrate in its radial direction, and thus suppresses variation in processing rate in every portion of the substrate W.

While the present invention has been described in detail, the foregoing description is in all aspects illustrative and not restrictive. It is therefore understood that embodiments of the present invention can appropriately be modified and omitted within the scope of the present invention.

What is claimed is:

1. A substrate processing apparatus comprising:
a rotating holder that rotates a substrate while holding the substrate horizontally;
a first nozzle that is used to mix a processing solution and pressurized gas to generate a jet flow of droplets of said processing solution, and to eject said jet flow of droplets onto an upper surface of said substrate in an approximately vertical direction;
a second nozzle that is used to discharge a continuous flow of said processing solution onto the upper surface of said substrate; and
a nozzle moving unit that integrally moves said first nozzle and said second nozzle above said substrate while maintaining a positional relationship between said first nozzle and said second nozzle, wherein
said nozzle moving unit moves said first nozzle and said second nozzle along respective arcuate paths, and moves said first nozzle so that a landing position, on said substrate, of said jet flow of droplets passes through a rotation center of said substrate, the arcuate paths having a common rotation axis and different lengths in a radial direction,
movement paths of the landing position of said jet flow of droplets and the landing position of said continuous flow on a rotation track of said substrate are different from each other, and
when said first nozzle is located above the peripheral portion of said substrate, a landing position, on said substrate, of said continuous flow is located closer to the rotation center of said substrate than the landing position of said jet flow of droplets and is also located downstream of the movement path of the landing position of said jet flow of droplets in a rotation direction of said substrate.

2. The substrate processing method according to claim 1, wherein
a direction of said continuous flow is tilted with respect to a vertical direction so that a distance between said jet flow of droplets and said continuous flow increases toward said substrate.

3. A substrate processing apparatus comprising:
a rotating holder that rotates a substrate while holding the substrate horizontally;
a first nozzle that is used to mix a processing solution and pressurized gas to generate a jet flow of droplets of said processing solution, and to eject said jet flow of droplets onto an upper surface of said substrate in an approximately vertical direction;
a second nozzle that is used to discharge a continuous flow of said processing solution onto the upper surface of said substrate; and
a nozzle moving unit that integrally moves said first nozzle and said second nozzle above said substrate while maintaining a positional relationship between said first nozzle and said second nozzle, wherein
said nozzle moving unit moves said first nozzle and said second nozzle along respective arcuate paths, and moves said first nozzle so that a landing position, on said substrate, of said jet flow of droplets passes through a rotation center of said substrate, the arcuate paths having a common rotation axis and different lengths in a radial direction,
movement paths of the landing position of said jet flow of droplets and the landing position of said continuous flow on a rotation track of said substrate are different from each other, and
when said first nozzle is located above the peripheral portion of said substrate, a rotational speed vector of said substrate at the landing position, on said substrate, of the continuous flow and a rotational speed vector of said substrate at the landing position, on said substrate, of said jet flow of droplets are directed away from each other.

4. The substrate processing method according to claim 3, wherein
a direction of said continuous flow is tilted with respect to a vertical direction so that a distance between said jet flow of droplets and said continuous flow increases toward said substrate.

* * * * *